United States Patent
Aue et al.

(10) Patent No.: US 6,728,796 B2
(45) Date of Patent: Apr. 27, 2004

(54) ARRANGEMENT AND METHOD FOR SIGNAL PROCESSING AND STORING

(75) Inventors: Axel Aue, Korntal-Muenchingen (DE); Dirk Martin, Filderstadt (DE)

(73) Assignee: Robert Bosch GmbH, Stuttgart (DE)

( * ) Notice: Subject to any disclaimer, the term of this patent is extended or adjusted under 35 U.S.C. 154(b) by 383 days.

(21) Appl. No.: 09/769,700

(22) Filed: Jan. 25, 2001

(65) Prior Publication Data

US 2001/0037350 A1 Nov. 1, 2001

(30) Foreign Application Priority Data

Jan. 25, 2000 (DE) .......................... 100 03 006

(51) Int. Cl.[7] .............. G06F 9/30; G06F 3/00; G06F 7/48; G06F 17/10
(52) U.S. Cl. .............. 710/22; 710/21; 710/23; 710/26; 708/303; 708/523
(58) Field of Search .............. 710/22, 21, 26, 710/23; 708/303, 523

(56) References Cited

U.S. PATENT DOCUMENTS 5,765,025 A * 6/1998 Morimoto et al. ............ 710/23
5,905,757 A * 5/1999 Kundmann et al. ......... 375/229
6,298,366 B1 * 10/2001 Gatherer et al. ............ 708/523

FOREIGN PATENT DOCUMENTS

JP  363211002 A * 9/1988 ............. 318/569

OTHER PUBLICATIONS

Tietze, Ullrich, "Halbleiter–Schaltungstechnik (Semiconductor Circuit Technology)," U. Tietze, Ch. Schenk, 9th ed., Springer Verlag, 1989, pp. 704–707.*

Tietze, Ullrich, "Halbleiter–Schaltungstechnik (Semiconductor Circuit Technology)," ibidem, pp. 807 ff.*

Tietze, Ullrich, "Halbleiter–Schaltungstechnik (Semiconductor Circuit Technology)," ibidem, pp. 833 ff.*

Schrüfer, Elmar, Signalverarbeitung: Numerische Verarbeitung digitaler Signale (Signal processing: numerical processing of digital signals), Carl Hanser Verlag, 1990, pp. 206–234.*

* cited by examiner

Primary Examiner—Jeffrey Gaffin
Assistant Examiner—Tammara Peyton
(74) Attorney, Agent, or Firm—Kenyon & Kenyon

(57) ABSTRACT

A method is described for storing and processing/filtering signals, as well as a memory arrangement, a signal processing arrangement and, in particular, a digital filter arrangement having a plurality of filter modules for digital processing/filtering of input values, having a memory area and a signal processing module, which contains in particular at least one multiplier-accumulator which has at least one multiplier and at least one adder. The input values, coefficients, and output values of the arrangement can be stored in the memory area and called up again therefrom as needed. The input values are gated with the coefficients to form output values. In order to alleviate the load on a higher-level microprocessor by digital processing/filtering of the input values, it is proposed that the digital filter arrangement have a Direct Memory Access controller for coordinating data transmission of the filter coefficients, input values and output values between the multiplier-accumulator and the memory area.

15 Claims, 3 Drawing Sheets

ARRANGEMENT AND METHOD FOR SIGNAL PROCESSING AND STORING

FIELD OF THE INVENTION

The present invention relates to a digital memory arrangement and signal processing arrangement, in particular a filter arrangement, having a plurality of filter modules for digital signal processing/storing, in particular filtering, of input values or input signals. The digital signal processing arrangement includes a memory area and at least one multiplier-accumulator (MAC) which has at least one multiplier and at least one adder. The input values, coefficients, in particular fixed filter coefficients, and output values of the signal processing arrangement can be stored in the memory area and called up again therefrom as needed. The multiplier forms products, in particular partial products for all filter modules, from the input values and coefficients, and the adder forms sums of the products, in particular of the partial products of all filter modules, as output values or output signals of the signal processing arrangement.

The present invention also relates to a method of storing values and of digital signal processing, in particular filtering, of input values or input signals in a digital filter arrangement. The input values, coefficients, in particular fixed filter coefficients, and output values of the memory arrangement or signal processing arrangement are stored in a memory area and called up again therefrom as needed. Products, in particular partial products for all filter modules, are formed from the input values and coefficients and sums of the products, in particular partial products of all filter modules, are formed in a multiplier-accumulator (MAC) of the signal processing arrangement as output values or output signals of the signal processing arrangement.

BACKGROUND INFORMATION

The most recent trend increasingly calls for digital, rather than analog, signal processing. The advantages of digital signal processing are the higher degree of accuracy and reproducibility, as well as reduced sensitivity to disturbances. The disadvantage is the higher circuitry cost, which, however, is becoming less and less important with the increasing degree of integration of digital circuits.

In digital signal processing, discrete sequences of digits (sampled and quantized signals), rather than continuous signals, are processed. To the degree to which digital signals are being digitally processed, digital signal processing arrangements, for example, filter arrangements and suitable memory arrangements, are also increasingly being used. Certain frequencies are eliminated or suppressed from the signal by digital filtering in order to improve the signal/noise ratio.

In motor vehicle controllers, filtering of the input signals or discrete input values is required for some engine control functions, for example. The controller is used for controlling certain functions in a motor vehicle, for example, of the internal combustion engine, the transmission, the brakes, or the air conditioning/heating. The controller has a microcontroller containing a processor. A control program is executed in the processor in order to perform the function of the controller. In executing the control program, input signals are processed and appropriate control commands are generated.

Digital signal processing, in particular filtering, of input values is relatively time- and computation-intensive. Therefore, it is known from the related art that digital signal processing, for example, digital filtering, of input values can be performed using a digital signal processor (DSP). A DSP can perform certain functions automatically, i.e., without support by the processor of the controller. The use of a DSP for digital signal processing, in particular filtering, of the input values has the advantage that digital signal processing, i.e., filtering, takes place without placing any load on the higher-level processor of the controller. The processor remains entirely available for performing control tasks. The use of a DSP for digital signal processing, in particular filtering, of the input values has the disadvantage that the DSP has a complex design and therefore its integration in a controller is cost- and time-intensive.

SUMMARY OF THE INVENTION

From the above disadvantages of the related art results an object of the present invention: to perform digital signal processing, in particular filtering, of input values as rapidly and reliably as possible without, however, the digital signal processing, i.e., filtering, placing extra load on a processor that is on a level higher than that of the signal processing arrangement, in particular the digital filter, for signal processing.

In order to achieve this object, the present invention proposes, based on the digital signal processing arrangement, in particular a filter arrangement, that the digital signal processing arrangement, i.e., filter arrangement, have a direct memory access (DMA) controller for coordinating data transmission of coefficients, in particular filter coefficients, input values or input signals, and output values or output signals between the multiplier-accumulator (MAC) and the memory area.

In the following, a filter arrangement will be described in detail. Further embodiments, in particular, the exemplary embodiment shown, however, should also be understood as referring generically to a signal processing arrangement or a memory arrangement having a signal processing module according to the present invention.

The design and the function of DMA controllers can be found in a plurality of manuals and specialized journals. In this respect, reference is made, for example, to Tietze, Ullrich: Halbleiter-Schaltungstechnik (Semiconductor Circuit Technology) U. Tietze, Ch. Schenk, 9th ed., Springer Verlag, 1989, pp. 704–707. A DMA controller has one or more DMA channels over which data transmission takes place from a memory area to any module of a microprocessor. In contrast to data transmission via an interface, where a plurality of commands is to be executed for transmitting one bit, which requires a plurality of clock cycles of the central processing unit (CPU) of the higher-level microprocessor, in the case of data transmission using the DMA controller, data transmission is only initiated by the CPU and the filtered output values are read from the memory area after filtering. Data transmission of the filter coefficients, input values, and the output values is coordinated by the DMA controller so that all of the digital signal processing, in particular filtering of the input values, takes place almost without using any processing time of the central processing unit of the microprocessor.

Thus, according to the present invention, a microprocessor of a signal processing device (e.g., a vehicle controller) of a higher level than the signal processing arrangement, in particular the filter arrangement, is extended by a multiplier-accumulator (MAC) having at least one multiplier and at least one adder, as well as a direct memory access (DMA) controller. The MAC and DMA controller extension of the microprocessor has a particularly simple structure and can be integrated into the higher-level signal processing device without considerable cost or effort.

The microprocessor is, for example, a component of a controller for a motor vehicle that is used for controlling certain functions in the motor vehicle. The controller processes, within the framework of vehicle function control, analog and/or digital signals. For certain control functions of the internal combustion engine, the signals are filtered. For this purpose, the analog input signals are converted into digital input values in an analog-digital converter (ADC) or the digital input values are used directly if they are available. The digital input values are stored in the memory area and are transmitted from there into the MAC via the DMA channel(s). In the MAC, the filtered output values are calculated and stored again in the memory area via the DMA channels. From there the output values are picked up by the microprocessor of the controller as filtered signal values.

According to an advantageous refinement of the present invention, it is proposed that the filter arrangement have an analog-digital converter (ADC) and a digital-analog converter (DAC), the DMA controller coordinating data transmission of the input values from the ADC into the memory area and of the output values from the memory area to the DAC. According to this refinement, the microprocessor of the higher-level signal processing device thus processes analog signals, which is digitized prior to digital filtering. The filtered output values is also converted back into analog output signals after digital filtering before they can be further processed by the microprocessor. In order to place the least possible load on the central processing unit of the microprocessor with the digital filtering of the signals, in particular with the conversion between analog and digital signals, data transmission between the ADC and the memory area and between the memory area and the DAC is also coordinated by the DMA controller.

According to a preferred embodiment of the present invention, it is proposed that the filter arrangement have an arrangement for forming the absolute value of the input values, the DMA controller coordinating data transmission of the input values from the memory area to the arrangement for forming the absolute value and from the arrangement to the MAC. The arrangement for forming the absolute value of the input values guarantees that digital filtering is only performed with positive input values.

The arrangement for forming the absolute value of the input values advantageously has a digital comparator. The comparator verifies whether an input value is greater or less than zero. If the input value is less than zero, the sign of the input value is inverted.

The memory area in which the filter coefficients, the input values, and output values are stored designed to be separate from the microprocessor in order not to interrupt the CPU in the performance of DMA activities. The memory area is advantageously designed as a random access read-write memory (RAM). Commands that describe which operations are to be executed with which values are also stored in the memory area.

According to a preferred embodiment of the present invention, it is proposed that the input values be filtered by the Finite Impulse Response (FIR) filtering method. An FIR filter is described, for example, in Tietze, Ullrich: Halbleiter-Schaltungstechnik (Semiconductor Circuit Technology), ibidem, pp. 807 ff. As an alternative, it is proposed that the input values be filtered by the Infinite Impulse Response (IIR) filtering method. An IIR filter is described, for example, in Tietze, Ullrich: Halbleiter-Schaltungstechnik (Semiconductor Circuit Technology), ibidem, pp. 833 ff.

As another method for achieving the object of the present invention, it is proposed on the basis of the method of digital filtering of input values of the above-mentioned type that data transmission of the filter coefficients, input values, and output values between the multiplier-accumulator (MAC) and the memory area be performed as a Direct Memory Access (DMA) transmission.

According to a preferred refinement of the present invention, it is proposed that the input values be filtered recursively. In recursive filtering, previous output values, in addition to the input values, are used for the new current output value. Recursive filtering of digital input values is described in detail in Schrüfer, Elmar, Signalverarbeitung: Numerische Verarbeitung digitaler Signale (Signal processing: numerical processing of digital signals), Carl Hanser Verlag, 1990, pp. 206–234, to which reference is expressly made here.

According to a preferred embodiment of the present invention, it is proposed that the partial products for all filter modules and the sums of the partial products of all filter modules be formed serially. In order to calculate an output value, the inputs of the multiplier of the MAC are passed once through all filter modules and the partial products obtained are added up in the adder. Serial implementation of the digital filter arrangement has the advantage that only one multiplier and only one adder are needed in the MAC, while parallel implementation of the digital filter arrangement requires a separate adder for each filter module and a separate multiplier for all filter modules as well as an additional multiplier.

DETAILED DESCRIPTION

Figure 1:
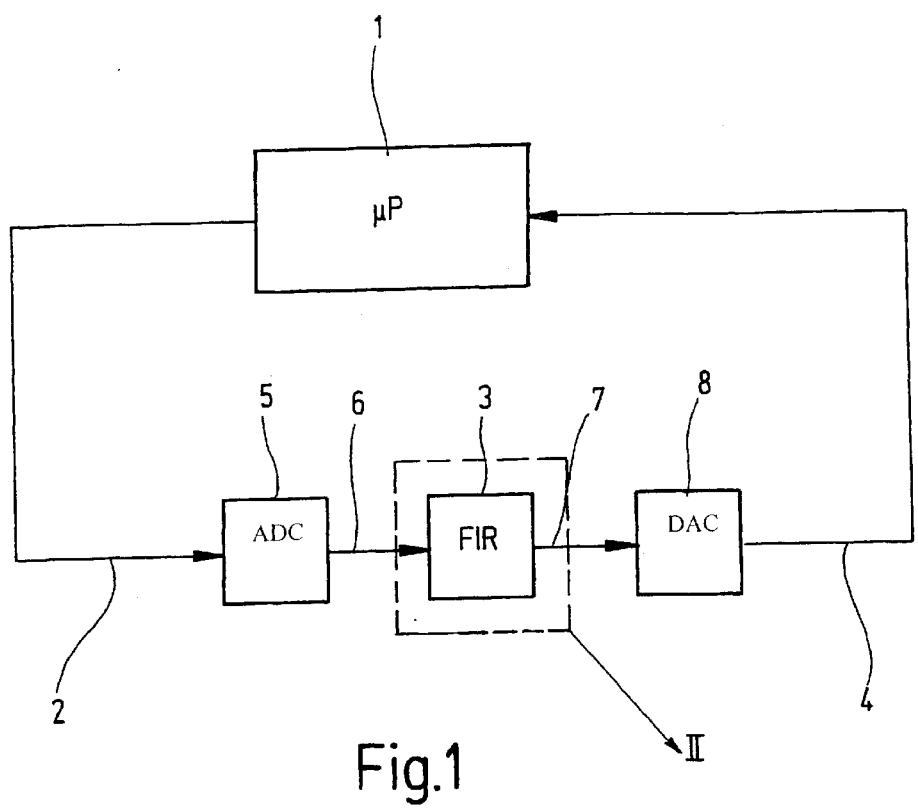
FIG. 1 shows a microprocessor having a digital filter arrangement according to the present invention.

FIG. 1 shows a microprocessor 1 of a controller for a motor vehicle. The controller is used for open-loop and closed-loop control of certain functions of the motor vehicle, for example, of the internal combustion engine, the transmission, the brakes, or the heating/air conditioning of the interior of the vehicle. In order to control the vehicle functions, microprocessor 1 processes input signals in an analog or digital form. In order to control certain vehicle functions, for example, to control the internal combustion engine, the input signals is filtered.

The most recent trend increasingly calls for digital, rather than analog, signal processing. The advantages of digital signal processing are the higher degree of accuracy and reproducibility, as well as reduced sensitivity to disturbances. The disadvantage is the higher circuitry cost, which, however, is becoming less and less important with the increasing degree of integration of digital circuits. In digital signal processing, discrete sequences of digits, rather than continuous variables, are processed. No analog input signals are applied to a digital filter, but instead discrete input values, and no analog output signal, but a sequence of discrete output values is output after filtering.

In FIG. 1, microprocessor 1 sends input signals 2 to be filtered to a digital filter 3 and receives filtered output signal 4 at the output of digital filter 3. Prior to actual digital filtering, the input signals are converted into discrete input values 6 by an analog-digital converter (ADC) 5, and filtered discrete output values 7 are converted into analog output signal 4 by a digital-analog converter (DAC) 8.

Figure 2:
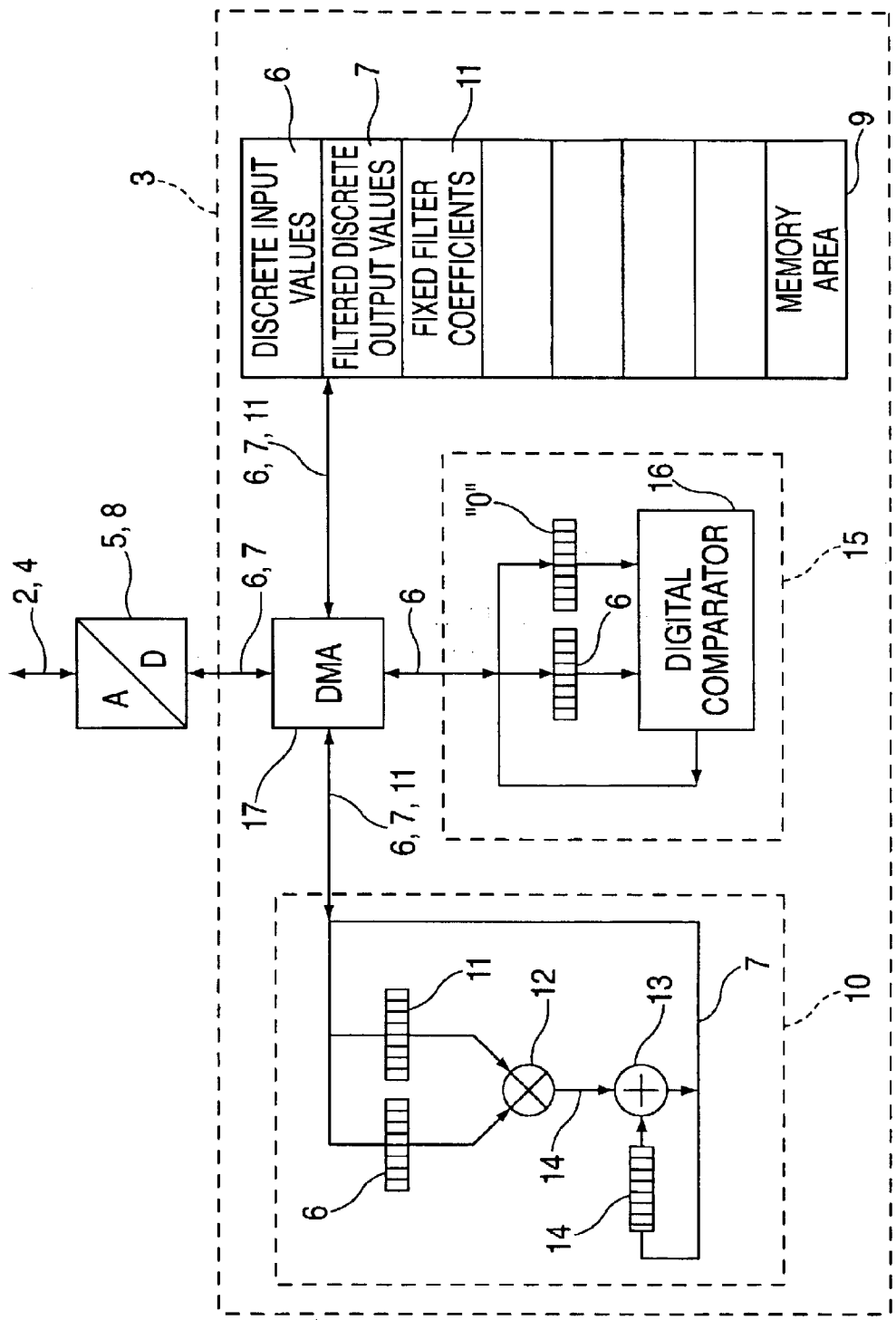
FIG. 2 shows a preferred embodiment of a digital filter arrangement according to the present invention.

An enlarged view of digital filter 3 according to the present invention is shown in FIG. 2. Digital filter 3 has a plurality of filter modules. The order of the digital filter corresponds to the number of filter modules. Digital filter 3 has a memory area 9 and a multiplier-accumulator (MAC) 10. Memory area 9 is designed as a random access read-write memory (RAM). Input values 6, fixed filter coefficients 11 of digital filter 3, and filtered output values 7 are stored in memory area 9 and are called up again therefrom as needed. MAC 10 has a multiplier 12 and an adder 13. Multiplier 12 forms partial products 14 for all filter modules of digital filter 3 from input values 6 and filter coefficients 11. Adder 13 forms sums of partial products 14 of all filter modules as output values 7.

Finally, digital filter 3 includes an arrangement 15 for forming the absolute value of input values 6. The arrangement 15 include a digital comparator 16, in which an input value 6 is compared with the value zero, and the sign of input value 6 is inverted if input value 6 is less than zero. By using the arrangement 15 for forming the absolute value of input values 6, it is achieved that only positive values are used in the digital filtering.

In order not to place excessive load on microprocessor 1 through the digital filtering of the input signals, digital filter 3 according to the present invention has a Direct Memory Access (DMA) controller 17. DMA controller 17 coordinates data transmission of filter coefficients 11 of input values 6 and output values 7 between MAC 10 and memory area 9. Furthermore, DMA controller 17 coordinates data transmission of input values 6 from analog ADC 5 into memory area 9 and of output values 7 from memory area 9 to DAC 8. Finally DMA controller 17 coordinates data transmission of input values 6 from memory area 9 to the arrangement 15 and from the arrangement 15 to MAC 10.

In addition to input values 6, output values 7, and filter coefficients 11, commands describing which operations should be executed with which values are also stored in memory area 9. These commands are executed by DMA controller 17. Microprocessor 1 only initiates digital filtering in order to digitally filter an input value 6. Data transmission and digital filtering is then coordinated by DMA controller 17. The microprocessor only receives filtered digital output value 7 from digital filter 3 at the end of the digital filtering and converts this value into an analog output signal 4.

Figure 3:
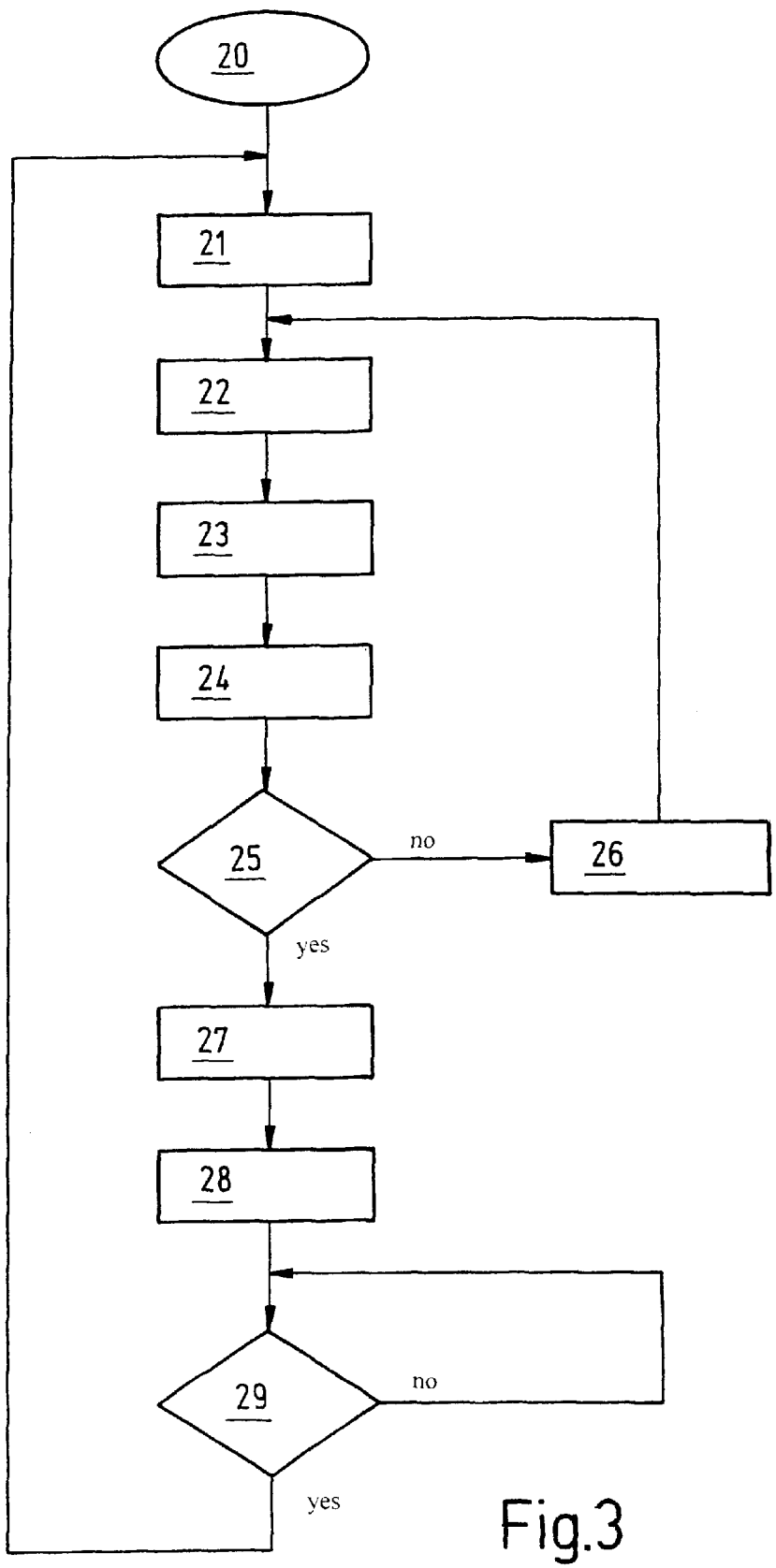
FIG. 3 shows a flowchart of a method according to a preferred embodiment of the present invention for digital filtering.

The sequence of the method according to a preferred embodiment of the present invention is shown in FIG. 3. The method starts in function block 20 with the initialization of microprocessor 1 and of digital filter 3. In a function block 21, a new input value 6 is stored in memory area 9. Subsequently in a function block 22, input value 6 to be filtered and a filter coefficient 11 of digital filter 3 are transmitted from memory area 9 into MAC 10 via a DMA channel of DMA controller 17. In function block 22, a filter coefficient 11 and input value 6 to be filtered are initially transmitted from memory area 9 via DMA controller 17 into MAC 10. In function block 23, partial product 14 is formed from input value 6 and filter coefficient 11 in multiplier 12. Subsequently in a function block 24, the sum of calculated partial product 14 and the sum of the partial products of all previous filter modules is formed by adder 13. In a query block 25 a check is performed to determine whether all filter coefficients 11 of digital filter 3 have been processed. If the answer is no, the next coefficient 11 is selected in function block 26 and the program branches off to function block 20 where input value 6 to be filtered and the next filter coefficient 11 are transmitted into MAC 10. This loop composed of function blocks 22 through 26 is run through until all filter coefficients 11 of digital filter 3 have been processed, i.e., until the digital filtering of input value 6 is completed. The sum of partial products 14, determined in adder 13, then forms filtered output value 7 of the digital filtering. Output value 7 is then stored in a function block 27 in memory area 9 via DMA controller 17. In a function block 28, first filter coefficient 11 of digital filter 3 is selected again. In a query block 29, there is a wait until a new input value 6 to be filtered is available. As soon as such an input value 6 to be filtered is available, the method according to the present invention is repeated for this input value 6.

A digital filter arrangement and a filtering method is described above as an example of the object of the present invention. This can be generalized for a digital signal processing arrangement and a memory arrangement having a signal processing module. Therefore in general the present invention includes a memory module to extend the capabilities of processing the data in the memory module, using in particular multipliers and adders without processor support. In particular, digital filters can be designed so that the load on the processor is minimized. This is achieved either by a digital signal processing arrangement, in particular a filter arrangement containing a memory area with a DMA controller, or by integrating a signal processing module into a memory arrangement having a DMA controller. Thus the processing is only initiated and can run with a very light load on the processor.

What is claimed is:

1. A memory arrangement, comprising:

a memory area;

a direct memory access controller; and a signal processing module including an arrangement for processing input values and coefficients to form output values, wherein:

the coefficients and the input values are stored in the memory area, one of a set including the input values and a set including the input values and the coefficients is loaded from the memory area into the signal processing module via a direct memory access using the direct memory access controller, one of the set including the input values and the set including the input values and the coefficients is gated by the arrangement for processing in the signal processing module to form the output values, and the output values are written into the memory area for a further use.

2. A digital signal processing arrangement for performing a digital signal processing of input values, comprising:

a memory area;

at least one multiplier-accumulator including at least one multiplier and at least one adder, wherein:

the input values, coefficients, and output values of the digital signal processing arrangement are capable of being stored in the memory area and called up again therefrom as needed, the input values are gated with the coefficients by the at least one multiplier and the at least one adder, the at least one multiplier forms products from the input values and the coefficients, and the at least one adder forms sums of the products as the output values of the digital signal processing arrangement; and a direct memory access controller for coordinating a data transmission of the coefficients, the input values, and the output values between the at least one multiplier-accumulator and the memory area.

3. A digital signal processing arrangement, comprising:

a plurality of filter modules for performing a digital filtering of input values;

a memory area;

at least one multiplier-accumulator including at least one multiplier and at least one adder, wherein:

the input values, fixed filter coefficients, and output values of the digital signal processing arrangement are capable of being stored in the memory area and called up again therefrom as needed, the at least one multiplier forms partial products for all of the plurality of filter modules from the input values and the fixed filter coefficients, and the at least one adder forms sums of the partial products of all the plurality of filter modules as the output values of the digital signal processing arrangement; and a direct memory access controller for coordinating a data transmission of the fixed filter coefficients, the input values, and the output values between the at least one multiplier-accumulator and the memory area.

4. The digital signal processing arrangement according to claim 3, further comprising:

an analog-digital converter; and a digital-analog converter, wherein:

the direct memory access controller coordinates the data transmission of the input values from the analog-digital converter into the memory area and of the output values from the memory area to the digital-analog converter.

5. The digital signal processing arrangement according to claim 3, further comprising:

an arrangement for forming an absolute value of each of the input values, wherein:

the direct memory access controller coordinates the data transmission of the input values from the memory area to the arrangement for forming the absolute value and from the arrangement for forming the absolute value to the at least one multiplier-accumulator.

6. The digital signal processing arrangement according to claim 5, wherein:

the arrangement for forming the absolute value includes a digital comparator.

7. The digital signal processing arrangement according to claim 3, wherein:

the memory area includes a random access read-write memory.

8. The digital signal processing arrangement according to claim 3, wherein:

the input values are filtered by a finite impulse response filtering operation.

9. The digital signal processing arrangement according to claim 3, wherein:

the input values are filtered by an infinite impulse response filtering operation.

10. A method of storing values in a memory arrangement including a memory area and a direct memory access controller, comprising the steps of:

causing a signal processing module in the memory arrangement to process the values in the memory arrangement in accordance with a signal processing module contained therein, wherein:

an arrangement included in the signal processing module processes input values and coefficients to form output values;

storing the coefficients in the memory area;

storing the input values in the memory area;

loading one of a set including the input values and a set including the input values and the coefficients from the memory area into the signal processing module via a direct memory access in accordance with an operation of the direct memory access controller;

causing the arrangement included in the signal processing module to gate one of the set including the input values and the set including the input values and the coefficients to form the output values; and writing the output values into the memory area for a further use.

11. A method of performing a digital signal processing of input values in a signal processing arrangement including a memory area and at least one multiplier-accumulator that includes at least one multiplier and at least one adder, comprising the steps of:

storing in the memory area and calling up therefrom the input values, coefficients, and output values;

gating the input values with the coefficients in accordance with the at least one multiplier and the at least one adder;

causing the at least one multiplier to form products from the input values and the coefficients;

causing the at least one adder to form sums of the products as the output values; and causing a digital memory access controller to coordinate a data transmission of the coefficients, the input values, and the output values between the at least one multiplier-accumulator and the memory area.

12. A method of performing a digital signal processing of input values in a digital signal processing arrangement, comprising the steps of:

storing in a memory area and calling up therefrom the input values, fixed filter coefficients, and output values in a memory area of the digital signal processing arrangement;

forming partial products for all filter modules in a multiplier-accumulator of the digital signal processing arrangement from the input values and the fixed filter coefficients;

forming sums of the partial products of all the filter modules as the output values of the digital signal processing arrangement; and performing a data transmission of the fixed filter coefficients, the input values, and the output values between the multiplier-accumulator and the memory area as a direct memory access transmission.

13. The method according to claim 12, wherein:

the digital signal processing corresponds to a filtering.

14. The method according to claim 12, further comprising the step of:

recursively filtering the input values.

15. The method according to claim 12, further comprising the step of:

serially forming the partial products for all the filter modules and the sums of the partial products of all the filter modules.

* * * * *